United States Patent [19]

Umemura et al.

[11] Patent Number: 5,272,383

[45] Date of Patent: Dec. 21, 1993

[54] METHOD AND APPARATUS FOR PREVENTING ERRONEOUS OPERATION IN NON-CONTACT PUSH-BUTTON SWITCH

[75] Inventors: Heihachiro Umemura, Sakai; Michio Shibata, Hirakata, both of Japan

[73] Assignee: Shinkoh Electric Co., Ltd., Osaka, Japan

[21] Appl. No.: 511,772

[22] Filed: Apr. 20, 1990

[30] Foreign Application Priority Data

Apr. 21, 1989 [JP] Japan ................................. 1-101992
May 15, 1989 [JP] Japan ................................. 1-121162

[51] Int. Cl.⁵ .................................................. H01J 1/56
[52] U.S. Cl. .................................... 307/112; 250/229
[58] Field of Search ................ 307/38, 39, 112, 113, 307/115, 116, 117, 134, 139, 140, 311; 361/160, 170, 173–177; 250/208.4, 229; 341/31; 200/308, 334, DIG. 42; 340/644, 686; 324/415, 417, 418, 424

[56] References Cited

U.S. PATENT DOCUMENTS

| | | | |
|---|---|---|---|
| 4,417,824 | 11/1983 | Paterson et al. | 400/477 |
| 4,442,425 | 4/1984 | Eibner | 340/365 S |
| 4,641,026 | 2/1987 | Garcia, Jr. | 250/229 |
| 4,774,407 | 9/1988 | Erbe | 250/227 |
| 4,795,900 | 1/1989 | Kokubu | 250/221 |
| 4,816,671 | 3/1989 | Umemura | 250/229 |
| 4,855,590 | 8/1989 | Bures et al. | 250/221 |

*Primary Examiner*—A. D. Pellinen
*Assistant Examiner*—David Osborn
*Attorney, Agent, or Firm*—Wenderoth, Lind & Ponack

[57] ABSTRACT

To detect a faulty operation in a non-contact switch, a pulse signal is applied to the light emitting element of non-contact switch. The thus input pulse signal is compared with an output signal generated by a light receiving element of the non-contact switch. The faulty operation of the non-contact switch is discriminated in accordance with the thus compared input and output signals. Also to detect a faulty operation of the non-contact switch, a switch assembly includes a main push-button and an auxiliary push-button concentrically located over and within the main push-button. When the main push-button operates properly, the blocking members associated with the main push-button and the auxiliary push-button are displaced together. On the other hand, when the main push-button malfunctions, the light blocking member of the auxiliary push-button blocks the passage of light within the non-contact switch. Thus, an erroneous operation resulting from jamming of the main push-button is prevented.

1 Claim, 17 Drawing Sheets

Fig. 3(A)
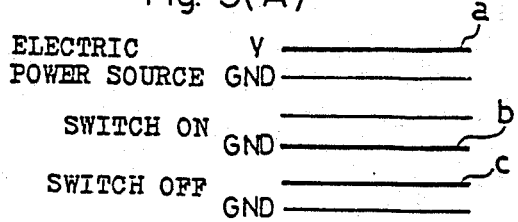
Fig. 3(D)
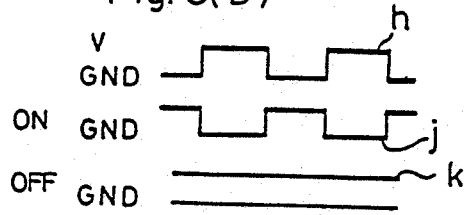
Fig. 3(B)
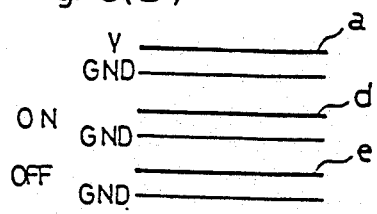
Fig. 3(E)
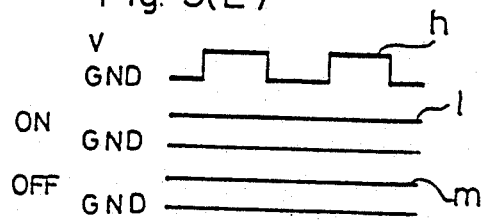
Fig. 3(C)
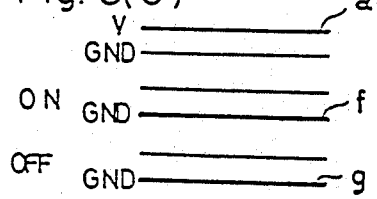
Fig. 3(F)
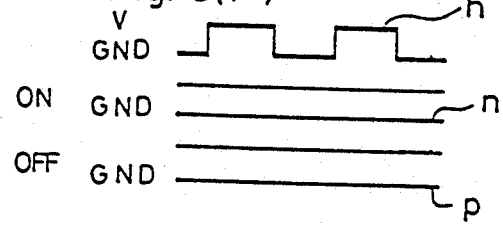
Fig. 5(A) ELECTRIC POWER SOURCE
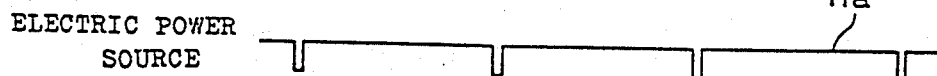
Fig. 5(B) PUSH-BUTTON ON/OFF
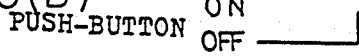
Fig. 5(C) PUSH-BUTTON OUTPUT
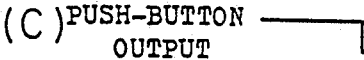
Fig. 5(D) CR INTEGRATION
Fig. 5(E) SCHMIDT
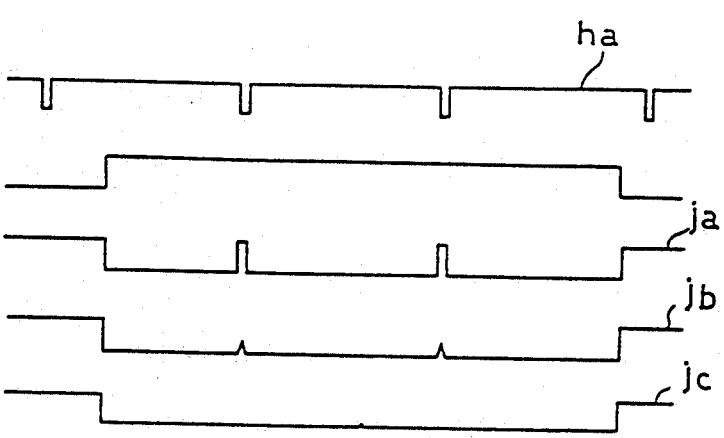

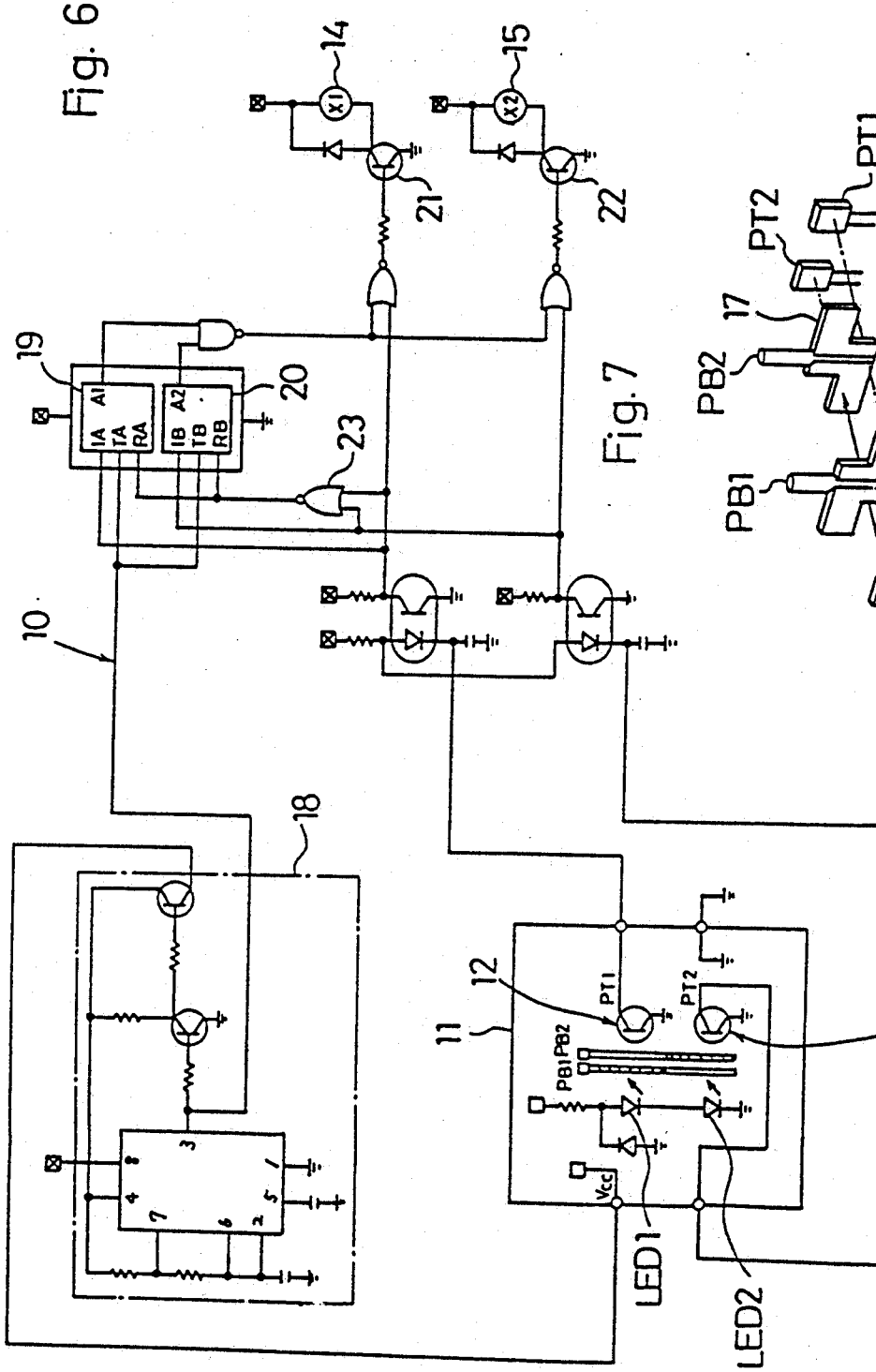

(A)

(B)

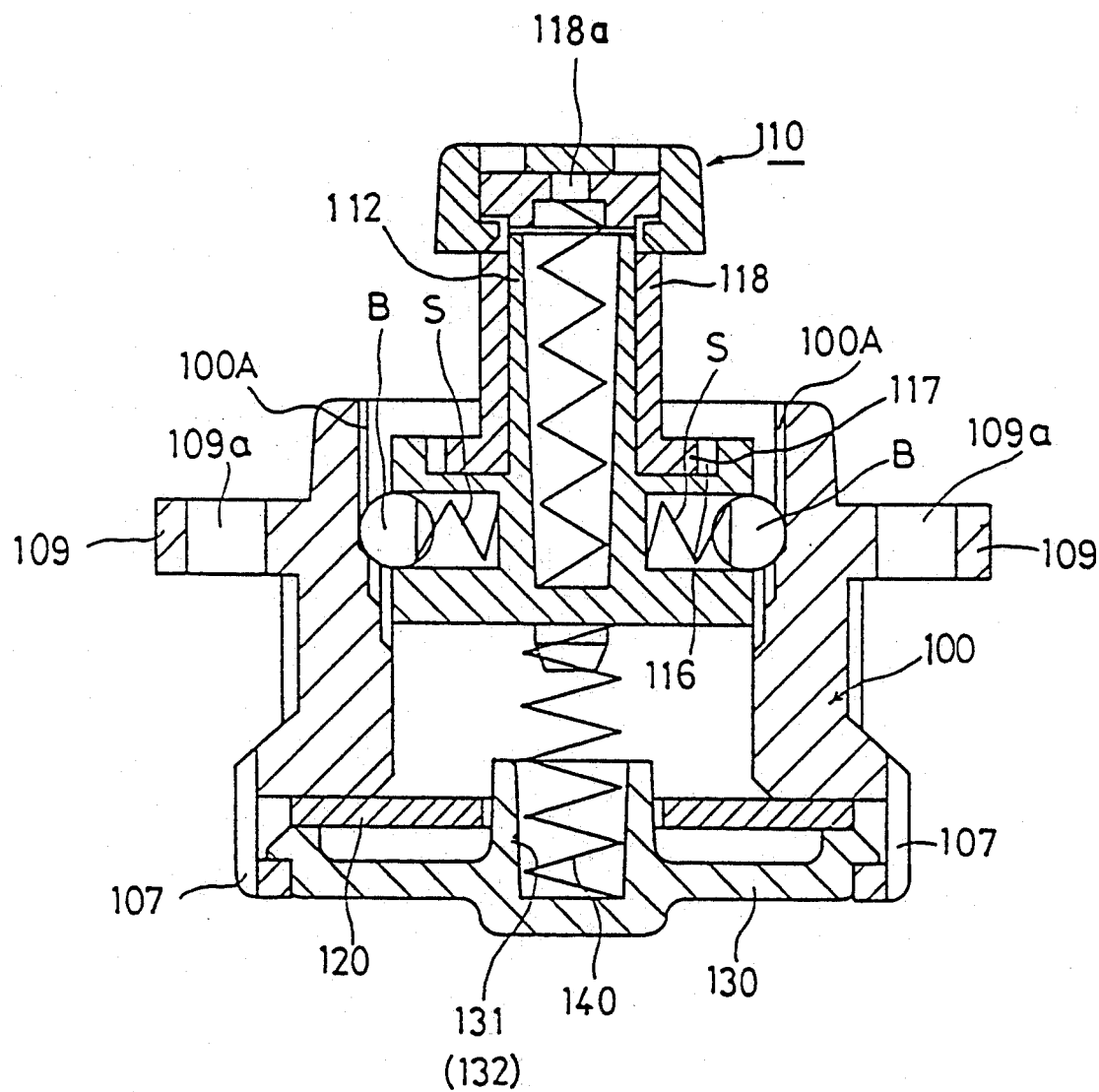

(B)

(A)

(B)

METHOD AND APPARATUS FOR PREVENTING ERRONEOUS OPERATION IN NON-CONTACT PUSH-BUTTON SWITCH

BACKGROUND OF THE INVENTION

1. Field of the Invention

This invention relates to a method and an apparatus for preventing erroneous operation in a non-contact push-button switch which is used as a pendant switch of hoist crane, for example.

2. Description of the Prior Art

Generally, as the pendant switch mentioned above, a contact type push-button switch has been used. However, in operating the push-button switch of this type, sparking takes place upon each operation resulting in an erosion of the contact and the service life of the switch is shortened. Also, in a low-voltage operation, an inferior contact takes place and the crane operation thus lacks accuracy. Moreover, in the case of a contact type multi-stage operation switch, the switch assembly must be made large.

In view of the above drawbacks of the contact type push-button switch, the present inventors previously suggested a non-contact type push-button switch which utilizes light (Japanese Patent Application No. 58-77860 and Japanese Patent Application No. 60-94294). This switch comprises a luminous element, a light receiving element and a push-button having a light shading plate provided between both elements and is designed so that light projection to the light receiving element is selectively controlled according to the position of the push-button.

Since the above pendant switch is suspended from a hoist crane, it is more readily subject to impact, vibration, etc.. That is, it must operate under severe conditions. Electronic parts of the push-button switch will more readily break-down than electronic parts contained in a control box, for example, when the switch breaks, if an operation signal is not given in spite of the operation of the push-button, although the crane is inoperable, the danger presented is minimal. However, if an operation signal is given continuously in spite of restoring the push-button to an OFF position, unintended movement of the crane will result, thus creating a very dangerous situation.

SUMMARY OF THE INVENTION

The present invention has been made in view of the above. The first object of the present invention is to prevent erroneous operation due to the malfunction of electronic parts of the non-contact switch.

The second object of the present invention is to prevent erroneous operation which takes place when the push-button has a mechanical malfunction, namely, when the push-button does not return to the original position due to the damage of a return spring or due to the wedging of foreign matter.

In order to attain the above first object, a method of preventing erroneous operation of a non-contact push-button switch of the present invention includes impressing pulse electric power to an input of the non-contact switch, discriminating the acceptability of an output signal from the switch by comparing the output signal with the waveform of the impressed pulse electric power at a discrimination circuit, and selecting and providing an operation signal to a driving circuit of an inverter, an electromagnetic contractor or the like.

According to the present invention, even if an ON operation signal output is given from the switch while the push-button is in an OFF state due to a malfunction of electronic parts constituting the non-contact push-button switch, an ON operation signal is not output from the discrimination circuit and, accordingly, the OFF state is maintained and unintended working of the apparatus or other related trouble does not take place.

In order to attain the above second object, the non-contact type push-button switch according to the present invention includes a push-button assembly having a main push-button and an auxiliary button inserted into the main push-button, with a spring for returning the auxiliary button interposed therebetween. Light transmits by making a light transmitting window of a light shading plate and a light transmitting window of an auxiliary light shading plate coincide with each other while the push-button is working normally. When the auxiliary button separates from the main push-button due to spring pressure, the light transmitting window of the light shading plate is blocked by the auxiliary light shading plate.

According to the present invention, when the pressed down main push-button does not return to its original position due to damage of the return spring or due to some other reason, only the auxiliary button returns and light projection is blocked by the auxiliary shading plate. Thus, a switch-off state is obtained.

BRIEF DESCRIPTION OF THE DRAWINGS

Features of the present invention will be understood more clearly from the following description made with reference to the accompanying drawings.

FIG. 1–FIG. 11 relate to embodiments of the present invention for the prevention of an erroneous operation due to the malfunction of electronic parts.

FIG. 1 is a block diagram of the basic electrical configuration of the present invention;

FIG. 2 is a waveform diagram of the configuration shown in FIG. 1;

FIG. 3(A) to (F) constitute an explanatory drawing showing relations between switch input and switch output signals in the configuration shown in FIG. 1;

FIG. 4 is a circuit diagram detailing a discrimination circuit and a synchronous signal conversion circuit of the invention;

FIG. 5(A) to (E) constitute an explanatory drawing showing a modified pulse signal and output signals of the invention;

FIG. 6 is a circuit diagram of the first embodiment of the present invention;

FIG. 7 is a perspective view of a non-contact push-button switch used in the embodiment of FIG. 6;

FIG. 8 is a circuit diagram of the second embodiment of the present invention;

FIG. 9 is a perspective view of the non-contact push-button switch used in the embodiment of FIG. 8;

FIG. 10 is a circuit diagram of the third embodiment of the present invention;

FIG. 11 is a perspective view of the non-contact push-button switch used in the embodiment of FIG. 10;

FIG. 12 is a cross section view of a non-contact push-button switch of the present invention;

FIG. 13 is a detailed view of a push-button switch assembly;

FIG. 14(A) is a front vertical section view in a normal OFF state, and FIG. 14(B) is a front vertical section view in which the spring 140 is in a damaged state;

FIG. 15(A) is a side vertical section view in a normal OFF state, and FIG. 15(B) is a side vertical section view in which the spring 140 is in a damaged state;

FIG. 16 is a detailed view of the push-button switch assembly during an ON operation state;

FIG. 17 is a detailed view of the push-button switch assembly during a malfunction state;

FIG. 18(A) is a perspective view illustrating the auxiliary button 110B fitted in the main button 110A in the normal OFF state, and FIG. 18(B) is an explanatory drawing illustrating the auxiliary button 110B arranged above the main button 110A and the state of both buttons immediately prior to fitting to each other; and, FIG. 19 is a bottom view of a block proper switch housing in which a back plate and a base plate are removed.

DETAILED DESCRIPTION OF THE PREFERRED EMBODIMENTS

FIG. 1 to FIG. 11 show embodiments of the present invention for preventing erroneous operation due to a malfunction of the electric parts of the non-contact switch.

FIGS. 3(A)-(F) illustrate voltage waveforms for explaining the principle of detecting an erroneous operation according to the present invention. Each of FIGS. 3(A)-(F) denote the relation between an input electric power applied to the switch and the output signal generated from the switch, the switch including a luminous body and a light receiving body for effecting a non-contact switching operation. FIGS. 3(A), (B) and (C) show the case where the input electric power source is direct constant current; FIGS. 3(D), (E) and (F) show the case of input pulse electric power.

FIG. 3(A) shows the case where the push-button switch works normally. That is, when an impressed electric power "a" is at a high level (hereinafter referred to as an H level), the output signal "B" when the switch is ON is at a low level (hereinafter referred to as an L level), and when the switch is OFF, output signal "c" is an H level. GND denotes the L level position.

FIG. 3(B) show the case where the luminous element of the switch does not properly emit light or where the light receiving element thereof does not work properly. In this case, irrespective of whether the switch is ON or OFF, output signals "d", "e" are at an H level.

FIG. 3(C) shows the case where the light receiving element is in operative state (i.e. a light receive state), even though the push-button is in an OFF state. In this case, the output signals "f" and "g" are at an L level, irrespective of whether the switch is actually intended to be ON or OFF. That is, the output of the switch always appears ON.

FIG. 3(D) shows the case where a pulse electric power source is applied to the switch and the switch works normally. In this case, the output signal "j" when the switch is ON is a pulse signal of reverse phase relative to the impressed pulse electric power "h", and the output signal "k" when the switch is OFF is at an H level.

FIG. 3(E) shows the case where the luminous element does not properly emit light or the light receiving element does not work properly, similar to FIG. 1(B). In this case, output signals "l" and "m" are at an H level, irrespective of whether the switch is ON or OFF.

FIG. 3(F) shows the case where the light receiving element is an operating state (i.e. a light receiving state), even though the push-button switch is in an OFF state. In this case, the output signals "n" and "p" of the switch are at an L level, irrespective of whether the switch is ON or OFF.

The present invention applies pulse electric power to the push-button switch and aims at preventing erroneous operation resulting from malfunctioning electronic parts by discriminating output signals of the push-button switch in comparison with the impressed pulse electric power.

Figure 1:
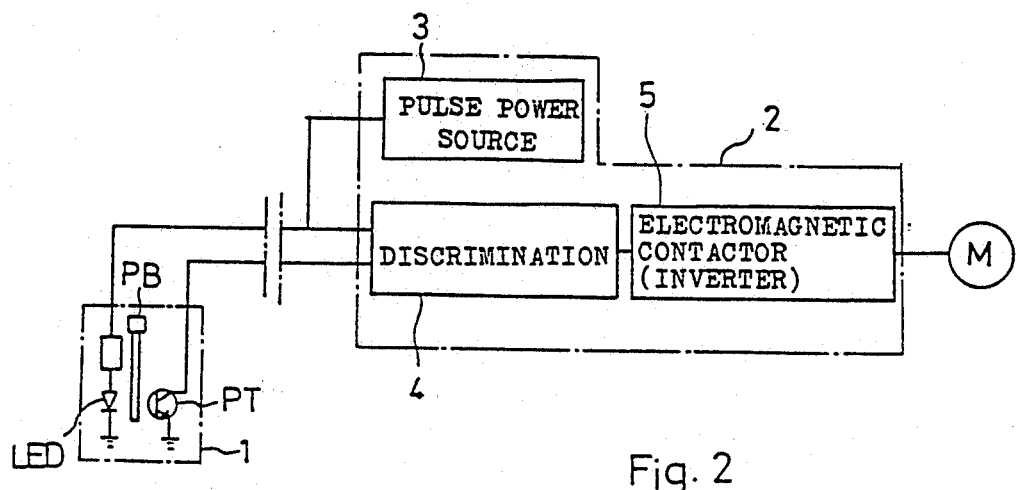

FIG. 1 is a block diagram of an apparatus for preventing erroneous operation according to the present invention in which pulsed electric power is applied to the push-button switch. A non-contact push-button switch 1 includes a luminous element LED and a light receiving element PT (photo-transistor, CD cell, photo-diode or the like) which are spaced from each other with a push-button PB therebetween. The push-button PB normally (in the OFF position) blocks light emitted by the luminous element LED from becoming incident on the light receiving element PT, and only when the push-button is pressed (ON), is light incident on the light receiving element PT.

Control circuiting 2, which forms an erroneous operation preventive apparatus for the non-contact push-button switch 1, includes a pulse electric power source 3 and a discriminating circuit 4.

Figure 2:
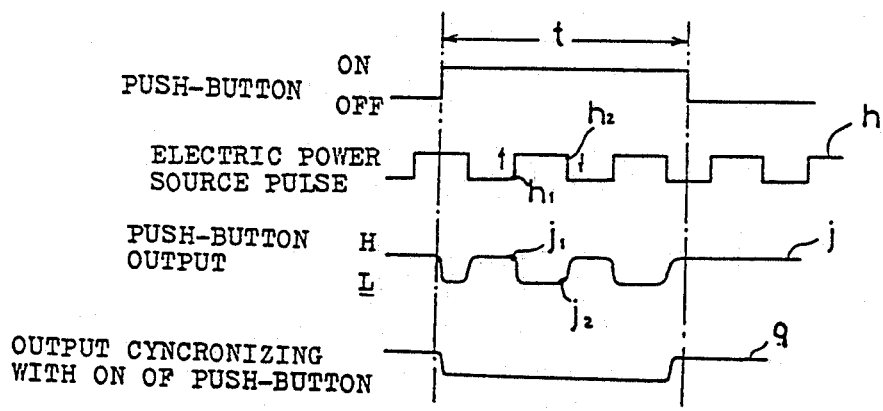

The pulse electric power source 3 impresses pulsed electric power on the luminous element LED, which radiates corresponding pulsed light. Referring to FIG. 2, by pushing the push-button PB (ON), light is projected onto the light receiving element PT during the pressing time "t" and the output signal "j" of the push-button switch is issued as a pulse signal of a reversed phase.

The output signal "j" is applied to the discrimination circuit 4. The pulse voltage "h" is also applied to the discrimination circuit 4 from the electric power source 3, and the thus applied signals "j" are compared on the basis of the pulse voltage "h".

That is, the output signals (ON, OFF output signals) of the push-button switch as shown in FIGS. 3(D), (E) and (F) are compared with the input pulse electric power. In the cases of FIGS. 3(D) and (E), the output of the push-button switch is at an H level when the electric power source is at an L level (the luminous element does not emit light), irrespective of whether the push-button is ON or OFF.

In consideration of the delay in the response of the light receiving element PT, referring to FIG. 2, if the point $j_1$ of the output signal "j" of the push-button switch (which corresponds to the point $h_1$ where the electric power source pulse "h" rises to the H level) is at an H level, the switch is judged to be normally operative, and if the output signal "j" at point $j_1$ of the push-button switch is at an L level as shown in FIG. 3(F), the switch is judged to be malfunctioning.

Figure 4:
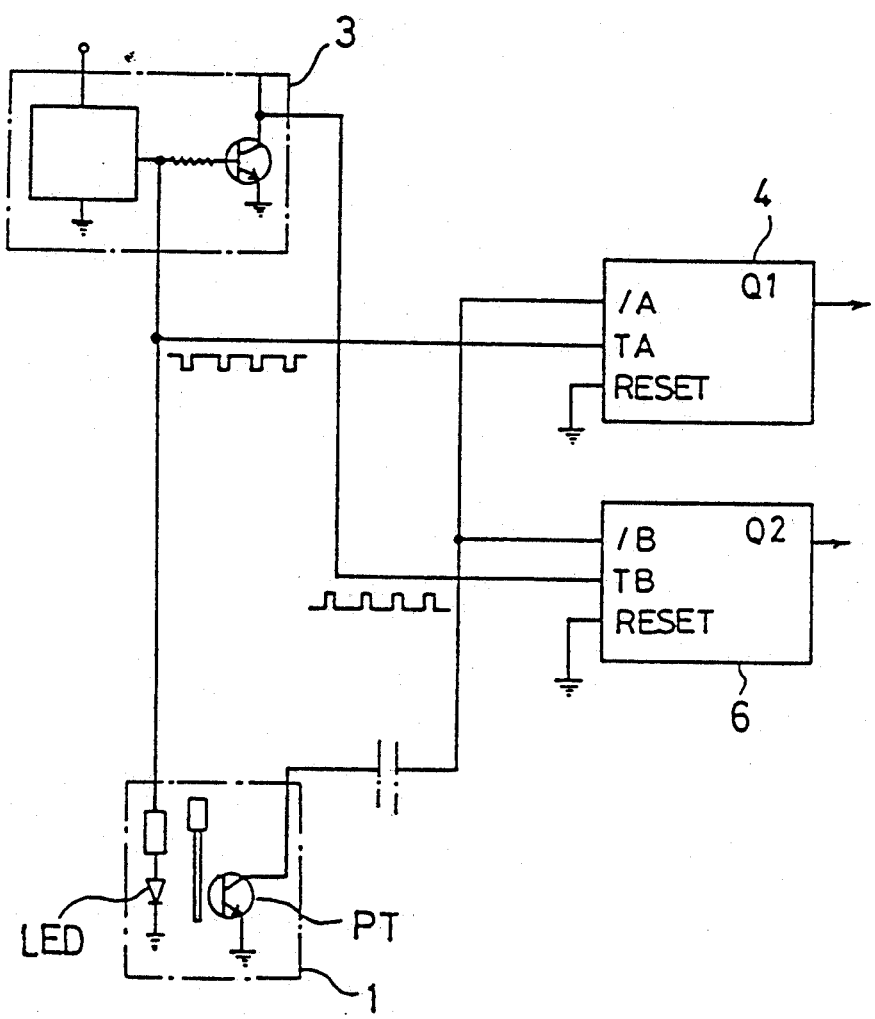

In order to carry out the above discrimination, the discrimination circuit 4 uses a shift register (C-MOS4015B), for example, as shown in FIG. 4.

An input terminal 1A of the discrimination circuit (hereinafter referred to as the shift register) is connected to an output terminal of the light receiving element PT. The input pulse for the push-button switch 1 is also input to a clock input terminal TA, whereby the shift register 4 transmits, via the output terminal Q1, the input to the input terminal 1A in response to the rise of the electric power source pulse. Therefore, the output terminal Q1 signal is at an H level in the cases depicted in FIGS. 3(D) and (E), and is at an L level in the case depicted in FIG. 3(F). Thus, the desired discrimination is made possible.

Thus, when the push-button switch is ON, the output of the circuit is a pulse signal. It is not preferable to impress such a pulse signal to a succeeding logic operation circuit or to a driving circuit 5 (shown in FIG. 1), such as an output relay. Therefore, it is necessary to convert the output pulse signal to a signal which changes its logic state in synchronism with the ON - OFF operation of the push-button PB as shown by signal "q" in FIG. 2.

As is obvious from FIG. 3(D) and FIG. 4, the light receiving element PT is in a light receiving state when the push-button PB is ON and the electric power source pulse is at an H level. In consideration of the delay of the light receiving element in response to the incident light, referring again to FIG. 2, if the point $j_2$ of the output signal of the push-button switch is at an H level in relation to the point $h_2$ at which the electric power source pulse to the push-button switch moves from an H level (the luminous element emits light) to an L level, the push-button switch can be judged as OFF, and if it is at an L level, the push-button switch can be judged as ON.

Therefore, a synchronizing signal conversion circuit 6 for outputting a signal "q" which is synchronized with the ON-OFF operation of the push-button switch can be composed as shown in FIG. 4, using a shift register (C-MOS4015B).

An output signal of the push-button switch 1 is input to an input terminal 1B of the synchronizing signal conversion circuit 6 (hereinafter referred to as a shift register), and a pulse which is inverted relative to the electric power source pulse applied to the push-button switch 1 is inputted to the clock terminal TB, whereby the shift register 6 transmits, via the output terminal Q2, data input to the input terminal 1B at the point where the electric power source pulse moves from an H level to an L level. As a result, the output of the shift register 6 becomes an L level when the push-button PB is ON, and becomes an H level when the push-button PB is OFF, and thus the desired output signal "q" as shown in FIG. 2 can be obtained.

As shown in FIG. 5, if an electric power source pulse of the push-button switch is generated as a pulse "ha" having long H level period and very short L level period, the output of the push-button switch 1 will take a form such as the waveform "ja". If this signal "ja" is amplified and then applied directly on the coil of the relay, a contact state can be maintained so long as the output "ja" of the push-button switch 1 is used. Thus, the synchronizing signal conversion circuit 6 for synchronizing with the ON-OFF operation of the push-button can be omitted.

If the above waveform is passed through a CR integration circuit, fluctuation can be minimized as shown by signal "jb", and if it is further passed through a Schmidt circuit, the fluctuation of the waveform almost vanishes and a signal "jc" in synchronism with the ON-OFF operation of the push-button can be obtained.

FIG. 6 to FIG. 11 show examples of circuits to which the present invention can be applied. An operation circuit 10 of the first embodiment shown in FIG. 6 is provided with two sets of switch units 12, 13, each of which operates a rely 14 and a relay 15, respectively. The switch unit 12 includes a luminous element LED1, a light receiving element PT1 and a push-button PB1 which is interposed between both elements. The switch unit 13 includes a luminous element LED2, a light receiving element PT2 and a push-button PB2 which is interposed between both elements.

The luminous elements LED1, LED2 and the light receiving elements PT1, PT2 are arranged as shown in FIG. 7. The push-button PB1 is provided with a light shading plate 16. While the push-button PB1 is not pressed (OFF position), the light shading plate 16 blocks light projected from the luminous element LED1 from becoming incident on the light receiving element PT1, but allows light projected from the luminous element LED2 to become incident on the light receiving element PT2. In contrast, while the push-button PB1 is pressed (ON position), light is projected to the light receiving element PT1, but is blocked from the light receiving element PT2. The other push-button PB2 is similarly provided with a light shading plate 17, which selectively blocks projected light as shown in FIG. 7. Thus, when both push-buttons PB1, PB2 are not pressed (OFF position), light is not incident on either of the light receiving elements. Similarly, when both push-buttons are pressed (by mistake, for example) light is not incident on either of the light receiving elements and erroneous operation is prevented.

Referring again to FIG. 6, reference numeral 18 (FIG. 6) denotes a pulse power supply circuit using an IC for timer (555) purposes.

The input pulse in this embodiment is a waveform "ha" shown in FIG. 5 (i.e. a waveform having a long H level period and very short L level period).

The output of each of the light receiving elements PT1, PT2 is applied to discrimination circuits 19, 20 (each formed of a shift register as mentioned above) in response to selective pressing of the push-buttons PB1, PB2, and the acceptability of each output signal is judged by each shift register. The output and a push-button signal are input and, together with an ON signal from the light receiving element PT1, operate a relay 14 through an amplification circuit 21. Similarly, when an ON signal from the light receiving element PT2 is given, a relay 15 is operated through an amplification circuit 22.

NOR gate 23 is provided for preventing erroneous operation of the push-button 11. The NOR of the two push-button output signals are input to reset terminals RA, RB of the shift registers 19, 20, and when ON signals are given from the light receiving elements PT1, PT2 at the same time, output signals from the shift registers 19, 20 are regarded as the same, as inferior signals, and are interlocked.

Figure 8:
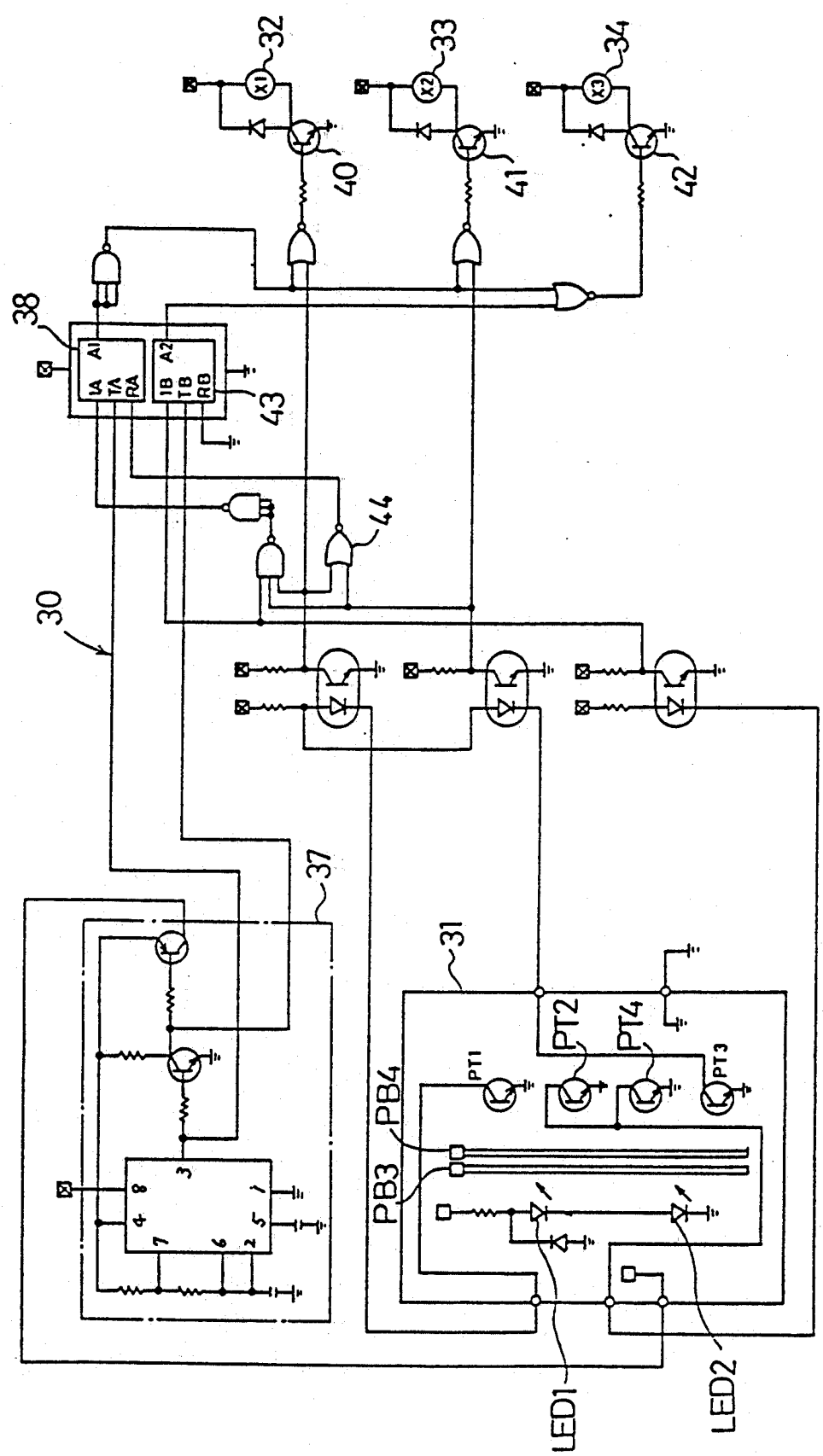
Figure 9:
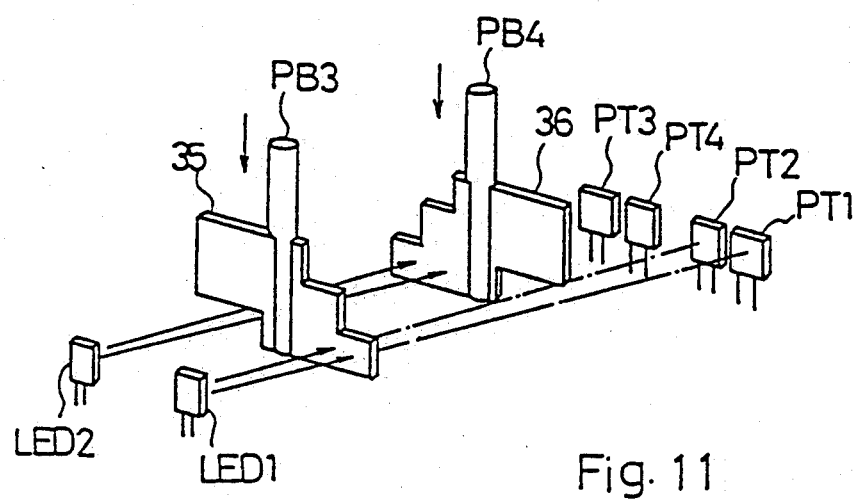

FIG. 8 and FIG. 9 show a second embodiment.

A non-contact push-button switch 31 of an operation circuit 30 includes a luminous element LED1, two light receiving elements PT1, PT2, a luminous element LED2, two light receiving elements PT3, PT4 and two push-buttons PB3, PB4. By two-step (two-stage) shifting of the push-buttons PB3, PB4, relays 32, 33, 34 are selectively operated.

As shown in FIG. 9, push-buttons PB3, PB4 are provided with light shading plates 35, 36. The light shading plate 35 blocks light projected to the light receiving elements PT1, PT2 when the push-button PB3 is not pressed (OFF position), allows light to project only to the light receiving element PT1 when the push-button PB3 is pressed a first step, and allows light to project to both light receiving elements PT1, PT2 when the push-button PB3 is pressed a second step. Light can be projected to the light receiving elements PT3, PT4 only when the push-button PB3 is in an OFF position, such light being blocked when the push-button PB3 is pressed the first and second steps.

Similarly, as is readily apparent from FIG. 9, the light shading plate 36 fitted to the other push-button PB4 allows selective light projection to the light receiving elements PT3, PT4.

Referring again to FIG. 8, reference numeral 37 denotes a pulse electric power source for generating a waveform pulse having a long H level period and very short L level period.

The output of each light receiving element PT1, PT2, PT3, PT4 is applied to a discrimination circuit formed of a shift register as mentioned above, and the discriminate output signals and signals from each light receiving element PT1, PT2, PT3, PT4 of the push-button switch 31 are applied to amplification circuits 40, 41, 42 for operating relays 32, 34, 34 as shown.

Signals from light receiving elements PT1, PT3 are applied to NOR gate 44 and the output thereof is input to a reset terminal RA of a discrimination circuit 38 (shift register), whereby when ON signals are given from the light receiving elements PT1, PT3 at the same time, the shift register 38 is reset and both signals are interlocked.

This embodiment illustrates the case where output signals of the light receiving elements PT2, PT4 are applied to a synchronizing signal conversion circuit 43 for converting to signals which synchronize with the ON-OFF operation of the push-buttons PB3, PB4.

Figure 11:
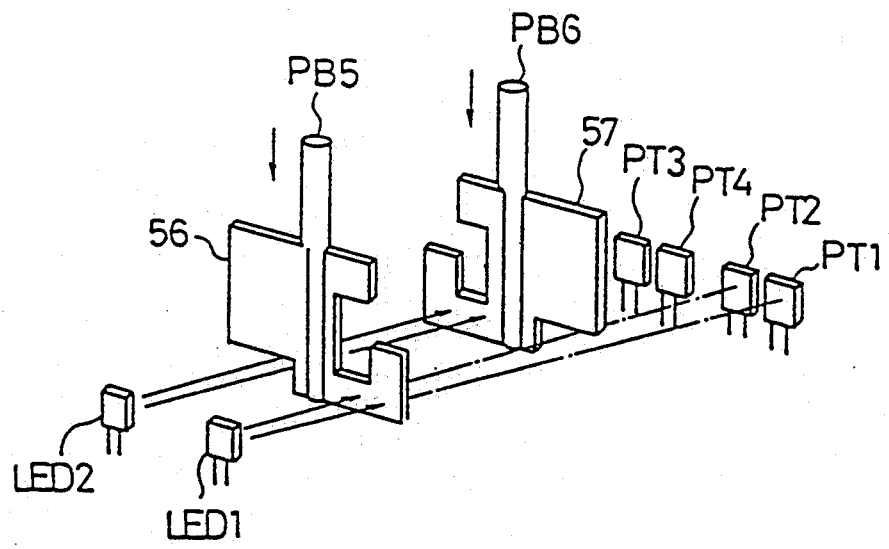
Figure 10:
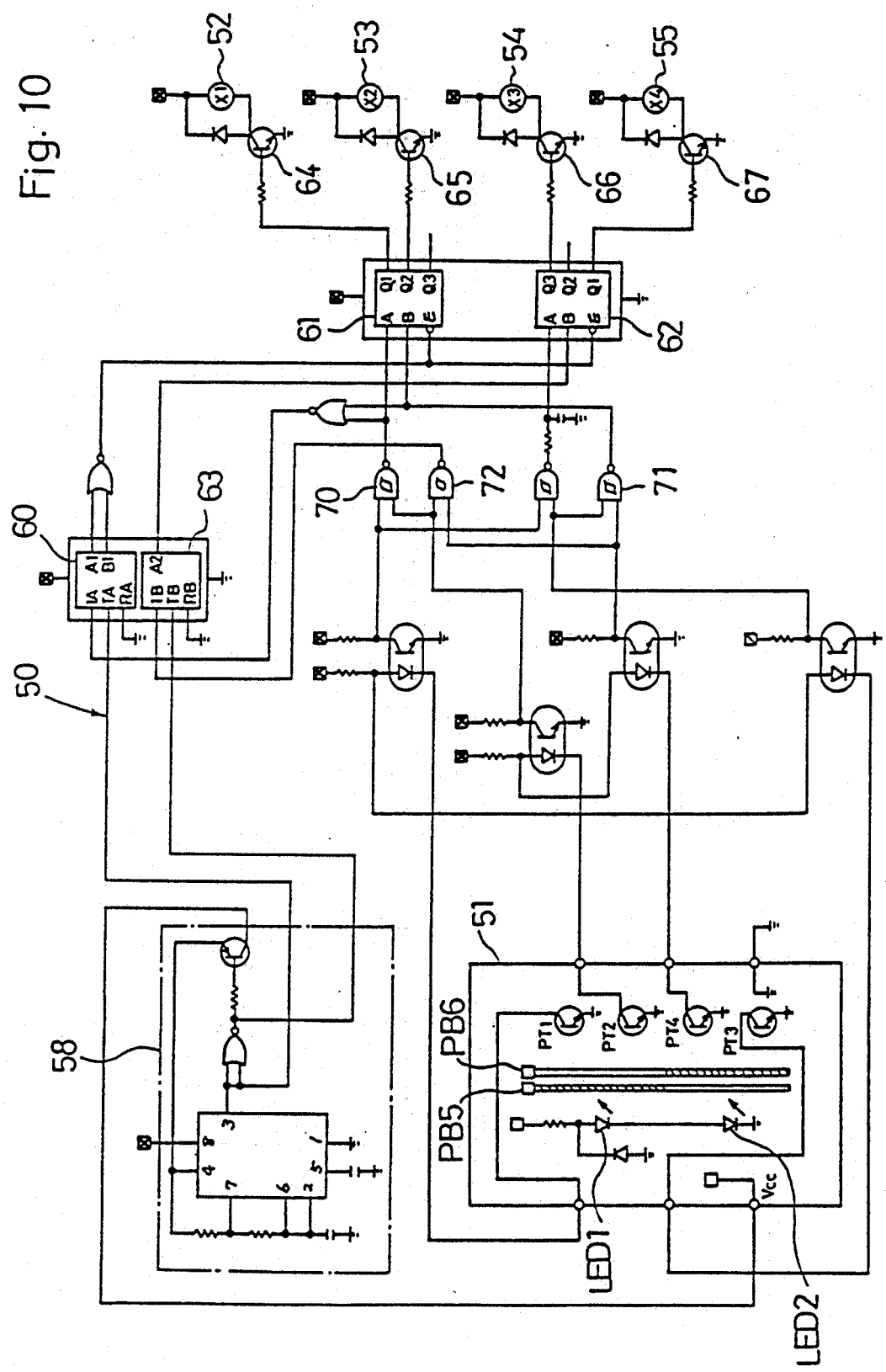

FIG. 10 and FIG. 11 how a third embodiment. A non-contact push-button switch 51 of a circuit 50 includes a luminous element LED1, two light receiving elements PT1, PT2, a luminous element LED2, two light receiving elements PT3, PT4 and a pair of push-buttons PB5, PB6. By three-step shifting of the push-button, four relays 52, 53, 54, 55 are selectively operated.

As shown in FIG. 11, the push-buttons PB5, PB6 are respectively provided with light shading plates 56, 57. The light shading plate 56 intercepts light projected to light receiving elements PT1, PT2 when the push-button PB5 is not pressed (OFF position), allows light to project only to the light receiving element PT2 when the push-button PB5 is pressed a first step, allows light to project to both light receiving elements PT1, PT2 when the push-button PB5 is pressed a second step, and allows light to project only to the light receiving element PT1 when the push-button PB5 is pressed a third step.

Light can be projected to the light receiving elements PT3, PT4 only while the push-button PB5 is in an OFF position and becomes blocked when pressed the first, second and third steps.

Similarly, as is readily apparent from FIG. 11, the light shading plate 57 fitted to the push-button PB6 allows selective light projection to the light receiving elements PT3, PT4.

Referring again to FIG. 10, reference numeral 58 denotes a pulse electric power source circuit using an IC for timer (555) purposes. The output waveform pulse has a long H level period and a very short L level period.

The output of each light receiving element PT1, PT2, PT3, PT4 is input to a discrimination circuit 60 through NAND gates 70, 71. The output signals of the light receiving elements PT2, PT4 are input to a synchronizing signal conversion circuit 63 through NAND gate 72 to generate output signals which synchronize with the ON-OFF operation of the push-button. Each of such output signals and signals of PT2, PT3, PT4 which passed through the NAND gates are input to selective circuits 61, 62.

By using a binary decoder (C-MOS, 4555B), for example, the selective circuits 61, 62 select the input O of the E terminal (the output of the discrimination circuit 60 is at an H level and the electronic parts normally operative) into output terminal Q1, Q2, Q3 due to an input variation (0 or 1) of terminals A, B and outputs it. When the input of the E terminal is 1 (the output of the discrimination circuit 60 is at an L level and electronic parts are inoperative), selective circuits 61, 62 are reset and the output is made OFF.

When the push-button PB5 is ON, Q1 of the decoder 61 becomes 1 and is amplified by an amplification circuit 64 to drive the relay 52. When the push-button PB6 is ON, Q2 of the decoder 61 becomes 1 and is amplified by an amplification circuit 65 to drive the relay 53.

The step to which the push-buttons PB5 and PB6 were pressed is judged by the decoder 62. More particularly, at the time of a two step operation, Q3 of the selective circuit 62 becomes 1 and is amplified by an amplification circuit 66 to drive the relay 54, and at the time of a three step operation, Q1 of the selective circuit 62 becomes 1 and is amplified by an amplification circuit 67 to drive the relay 55. Thus, the step to which the push-buttons PB5 and PB6 were operated is realized by the operation of the relays 52, 53, 54, 55.

According to the present invention, pulse electric power is used as an input for operating a non-contact push-button switch, the output signal from the switch is compared with a waveform of the pulse input signal, and only when the switch output signal is judged to have a normal pulse waveform, is an operation signal given. Therefore, in the event that an "ON" output is given from the switch even though the push-button is in an OFF state due to a malfunction of electronic parts constituting the non-contact push-button switch or due to some other reason, an "ON" operation signal is not output from the discrimination circuit and unintended working of the apparatus does not take place.

Furthermore, the non-contact push-button switch according to the present invention has a construction including a luminous element, a light receiving and a push-button having a light shading plate interposed between the luminous element and the light receiving element, and pulse electric power is input to the luminous element. Under this construction, even if a signal line, a power source line of the luminous element and an earth line make cross-contact in a cable between the push-button switch and the control box, such can be judged by the discrimination circuit and an operation signal is not given. Thus, safety is ensured.

FIG. 12 to FIG. 19 relate to the prevention of an erroneous operation of the push-button switch due to mechanical failures. Like parts are designated by like reference numerals in FIGS. 12-19.

As shown in FIGS. 12-19, reference numeral 100 designates a housing of the push-button switch made of material which is light weight, durable and insulating, such as synthetic resin. The housing 100 has at the back thereof two push-button inserting grooves 101 through which two opposing push-buttons 110 are inserted. A light shading plate inserting groove 102 opens at its both ends into the respective push-button inserting grooves 101. Each push-button 110 is provided with a light shading plate 111. The size of the light shading plate inserting groove 102 is such that when each push-button 110 is inserted into a respective push-button inserting groove 101, each light shading plate 111 is inserted into the light shading plate inserting groove 102, overlapping each other. Provided at the central part of the housing 100 are element inserting grooves 103, 104 (FIG. 19), having inserted thereto a light receiving element PT (photo-transistor, CDS cell, photo-diode or the like) and a luminous element LED which are opposed to each other with the light shading inserting groove 102 interposed therebetween. In the embodiment two element inserting grooves 103, 104 are arranged in parallel so that two sets of light receiving elements and luminous elements are used, but it is possible to use only one set of elements. In the case where a single pair of luminous element and light receiving element is used, the single stage (or step) ON-OFF operation is carried out. In the case of two-stage or three-stage operation, two pairs light receiving elements are used. The element inserting grooves 103, 104 open only at the bottom surface of the housing 100 and one element is inserted independently into each groove. A light transmitting hole (not shown) is made in the inner wall of this groove so that the light of the luminous element reaches the side of the light receiving element.

The outer shape and the size of the push-button 110 are determined so that the push-button 110 does not vibrate and slides smoothly in the push-button inserting groove 101. The push-button 110 includes a main push-button 110A and an auxiliary button 110B slidably disposed on the upper outer periphery of the main push-button 110A. A hole is made in a lateral direction at the lower part of the main push-button 110A and in this hole, a spring S and a ball B for action are disposed. A stepped surface 100A is formed at the inside surface of the push-button inserting groove 101 of the housing 100. This stepped surface 100A, together with the ball B which is pressed by the Spring S, makes it possible to carry out the pressing down operation of the push-button in stages (two-stage or three-stage).

An explanation is given below regarding the main push-button 110A.

A pushing piece 112 is provided at the top surface of the main push-button 110A and a spring stop projection 113 is provided at the opposite side of the pushing piece 112. A light shading plate 111 provided at the side of the pushing piece 112 has at its upper end portion a light transmitting window 114 to permit the light of the luminous element on the push-button side to reach the opposite light receiving element when the push-button is pressed down. A push-button light shading piece 115, which intercepts the light between both elements of the other push-button when the push-button is pressed down, is provided at the outer end portion of the light shading plate 111. The light shading plates 111 of the two push-buttons are located so that the light transmitting window 114 of one of the push-buttons corresponds to the pushed-down light shading piece 115 of the other push-button.

An auxiliary button 110B is mounted on a hollow member 116 disposed at the top surface of the main push-button proper 110A. A pushing piece 118, which is located on the pushing piece 112, is provided protrudingly at the upper part of a main part 117 of the auxiliary button 110B, and an auxiliary light shading plate 119 is provided at one side end of the main part 117 (FIG. 18(B)).

When the pushing piece 112 of the main push-button 110A is fitted in the pushing piece cavity 118h of the auxiliary button 110B, a spring 110S is interposed between the top surface of the pushing piece 112 and the inner ceiling surface of the cavity 118h. By the action of the spring 110S, the main push-button 110A and the auxiliary button 110B are forced to separate from each other. The auxiliary light shading plate 119 of the auxiliary button 110B, when the main push-button 110A works normally, operates together with the light transmitting plate 111, and when the main push-button 110A is unreturnable due to damage of a return spring 140 (to be described later) or due to some other reason, the auxiliary button 110B returns in such a manner that it is pushed up by the spring 110S and blocks the light transmitting plate 111.

A small hole 118a is made at the top surface of the pushing piece 118 of the auxiliary button 110B and by inserting a fine rod R in this hole 118a, the pushing piece 112 of the main push-button 110A can be pushed down and it is thus possible to confirm whether or not the push-button 110 is out of order.

A base plate 120 is of a size that can be fitted in a guide 107 provided around the bottom of the housing 100 and is provided with printed wiring. The luminous element LED and the light receiving element PT are arranged on the base plate 120. The one or more pairs of the luminous element LED and the light receiving element PT are opposed to each other. These elements are inserted in the element inserting grooves 103, 104 of the housing 100.

A bottom lid 130 is provided at the bottom of the housing 100 in such a manner that presses and fixes the base plate 120. The bottom lid 130 is intended to prevent the penetration of dust into the housing and is made of an insulating material. The bottom lid 130 is provided with support parts 131, 132 which support the spring 140.

Figure 12:
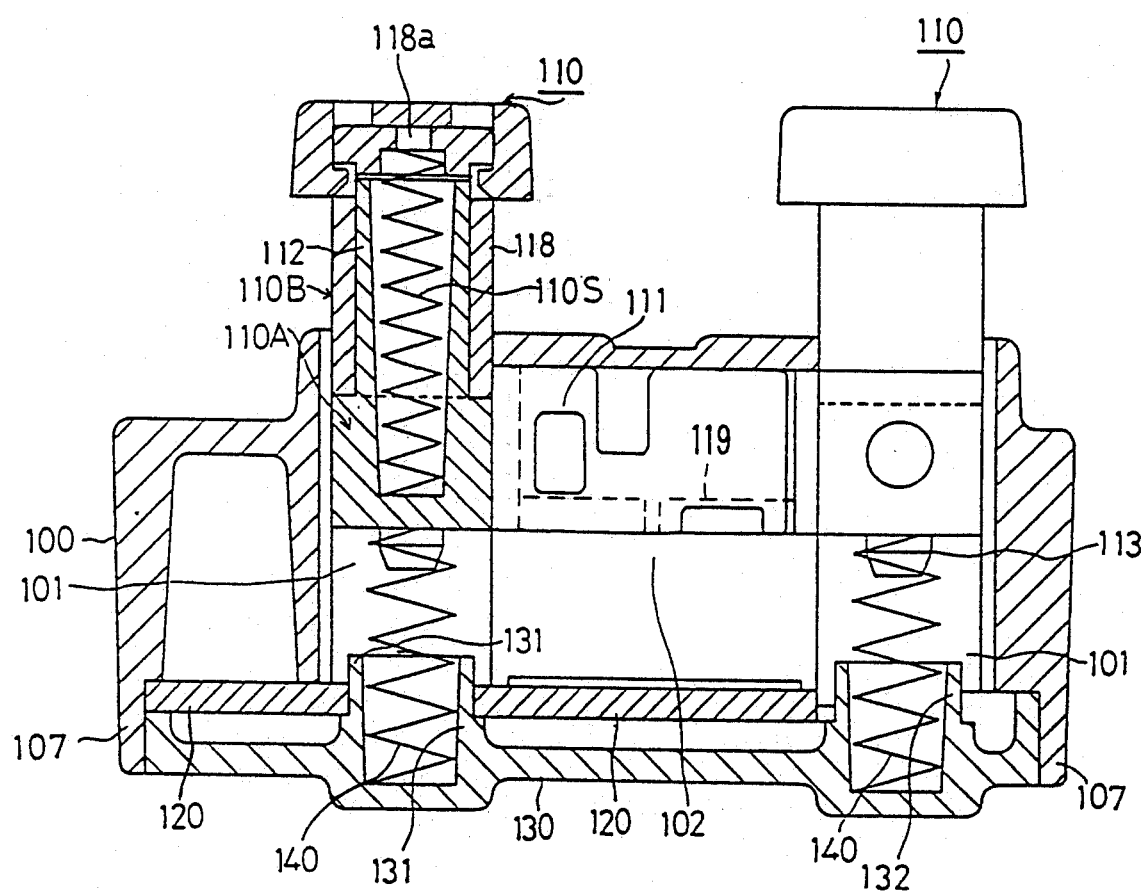
FIG. 12–FIG. 19 relate to embodiments of the present invention for the prevention of an erroneous operation due to the malfunction of mechanical parts.
Figure 13:
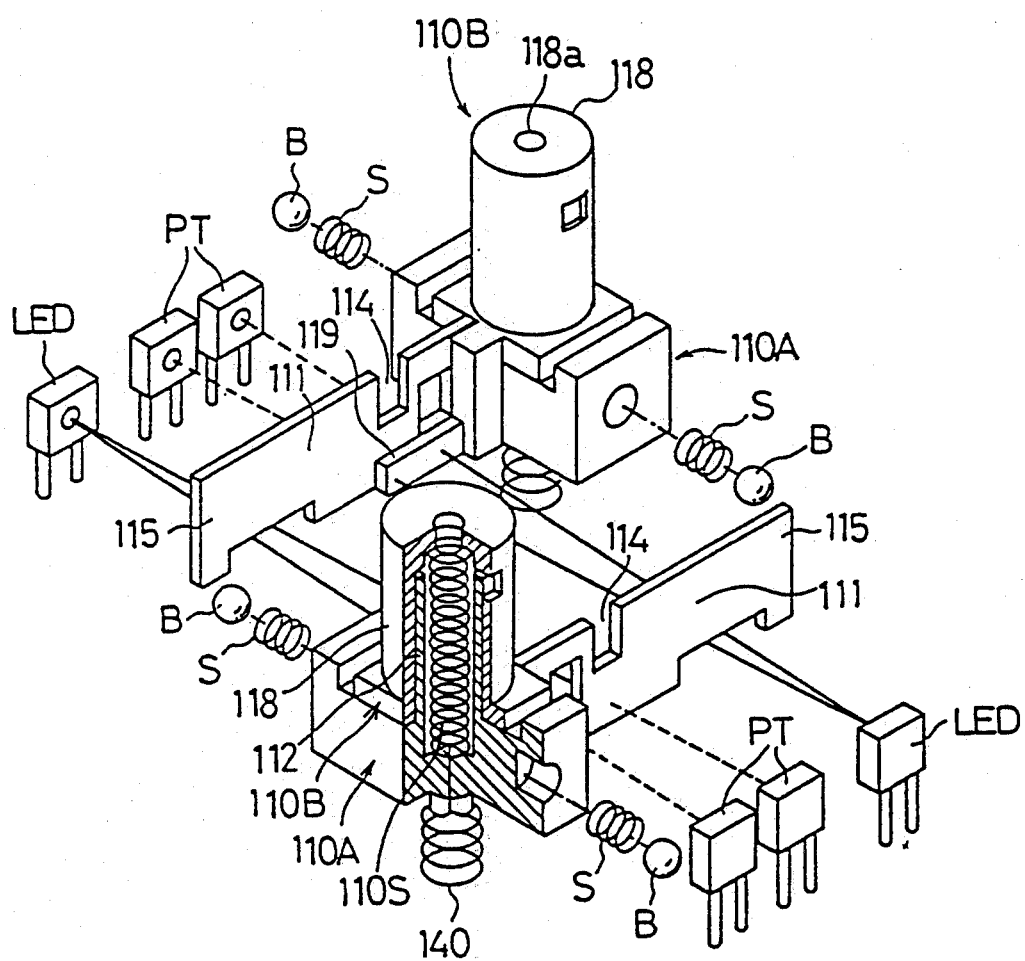
Figure 14:
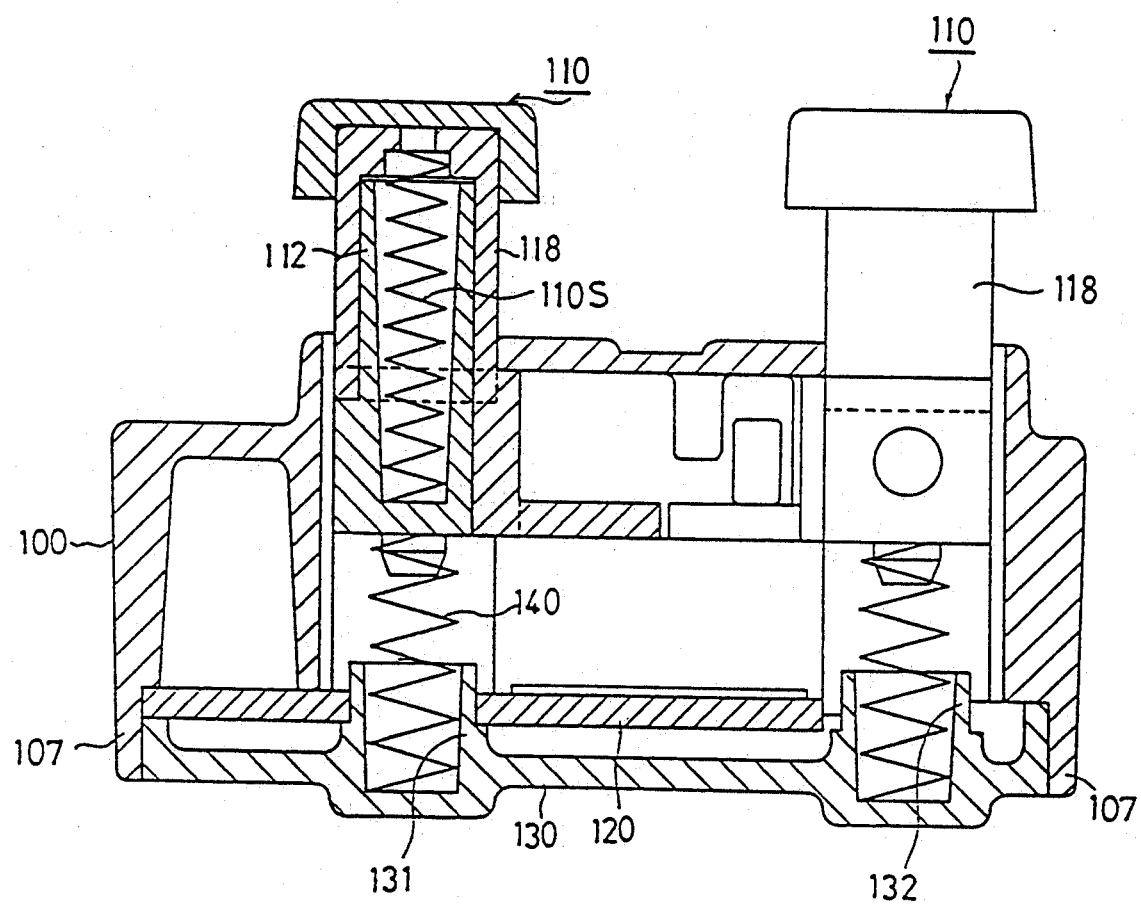
Figure 14:
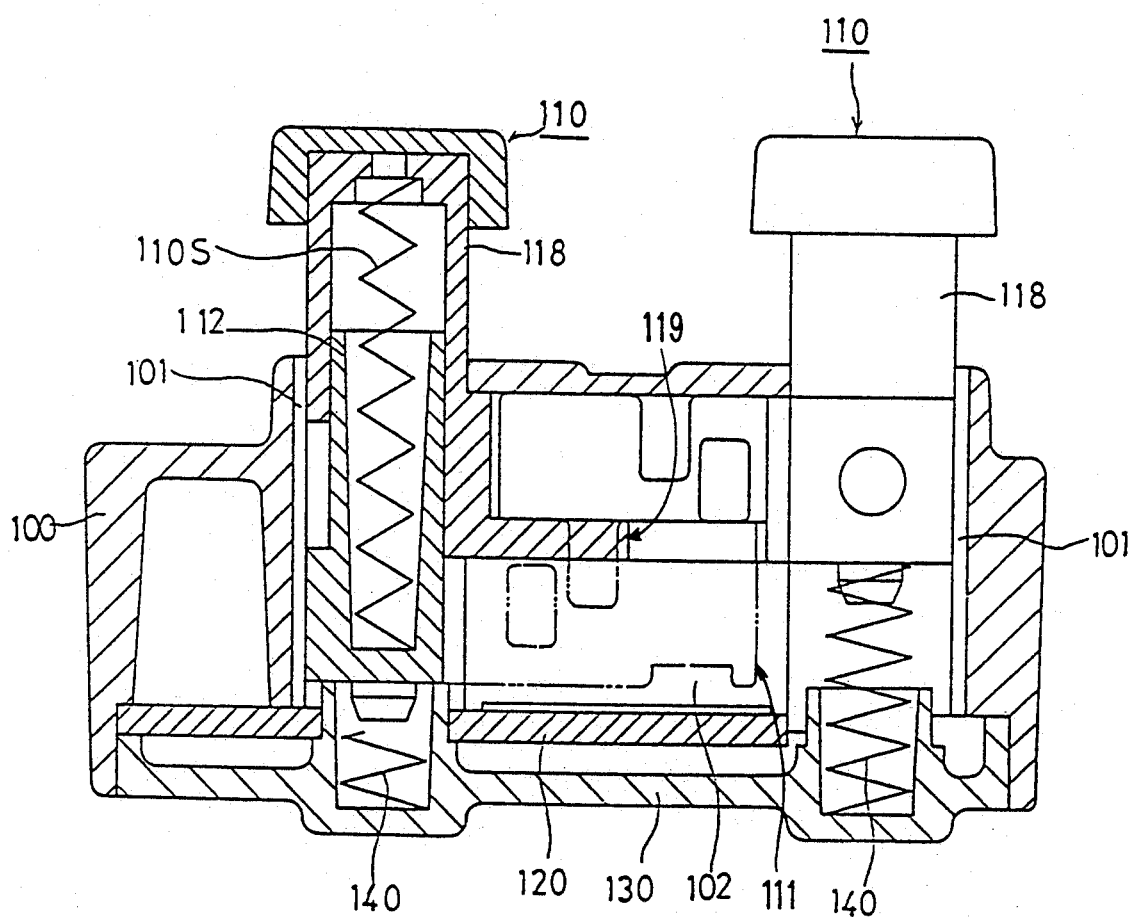
Figure 15:
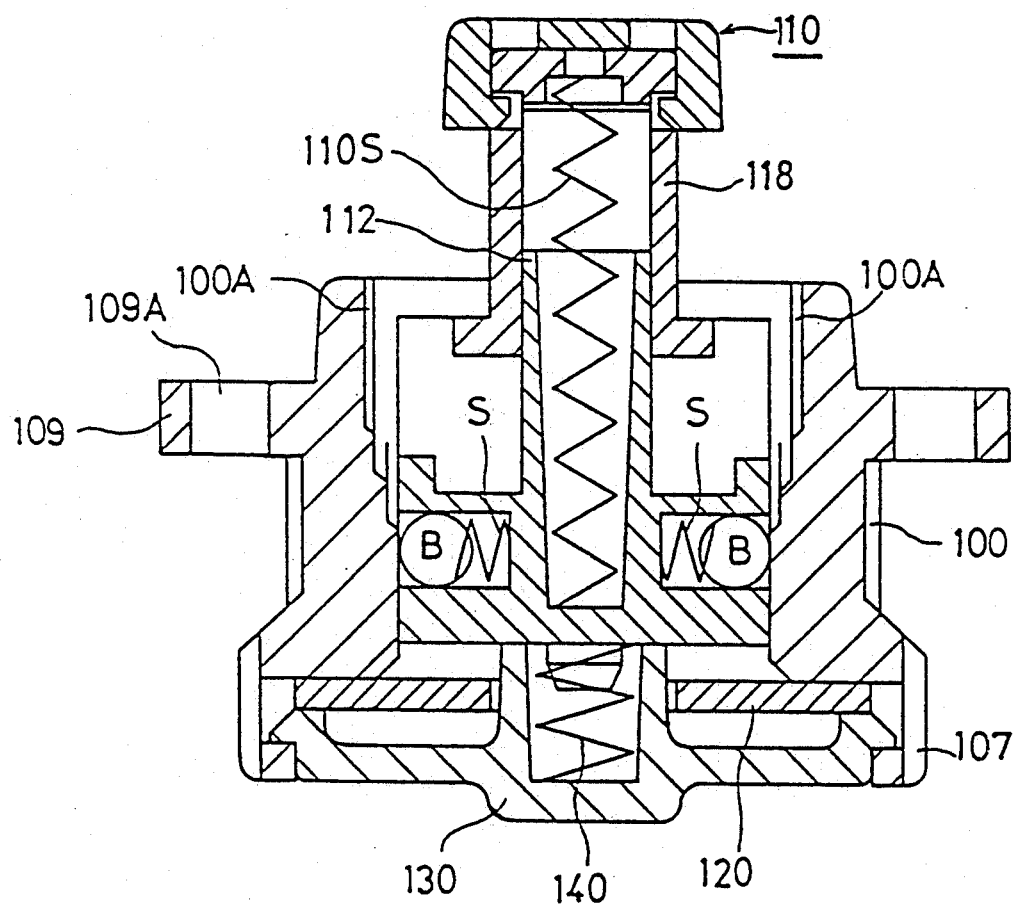
Figure 16:
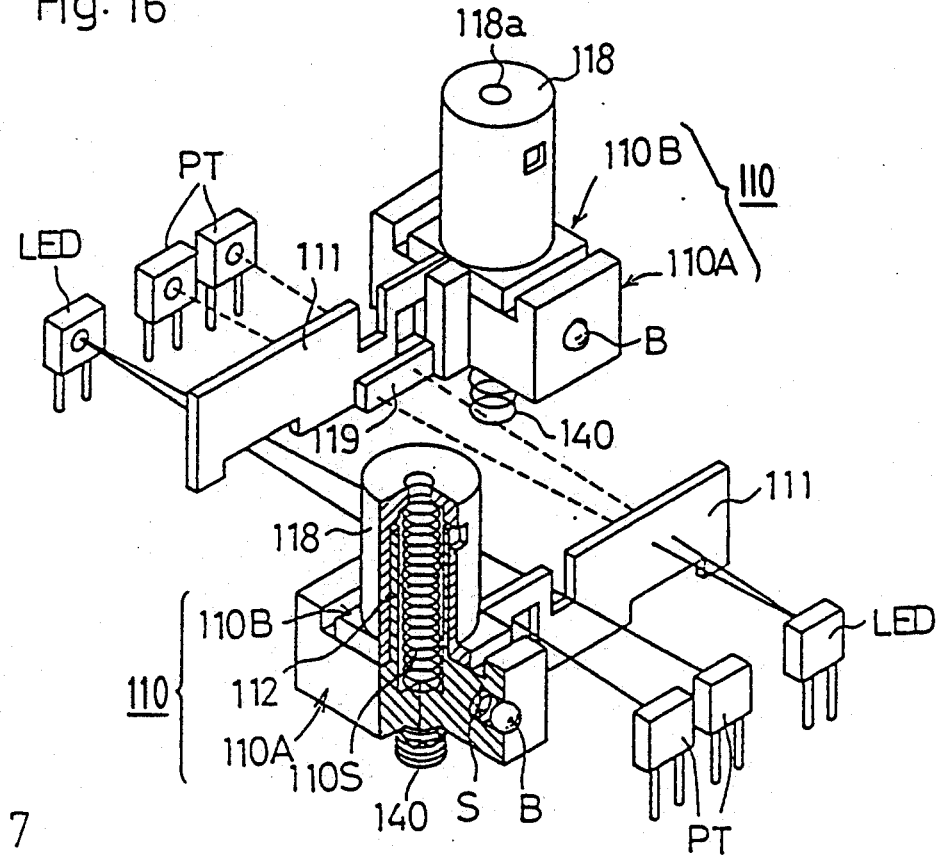
Figure 17:
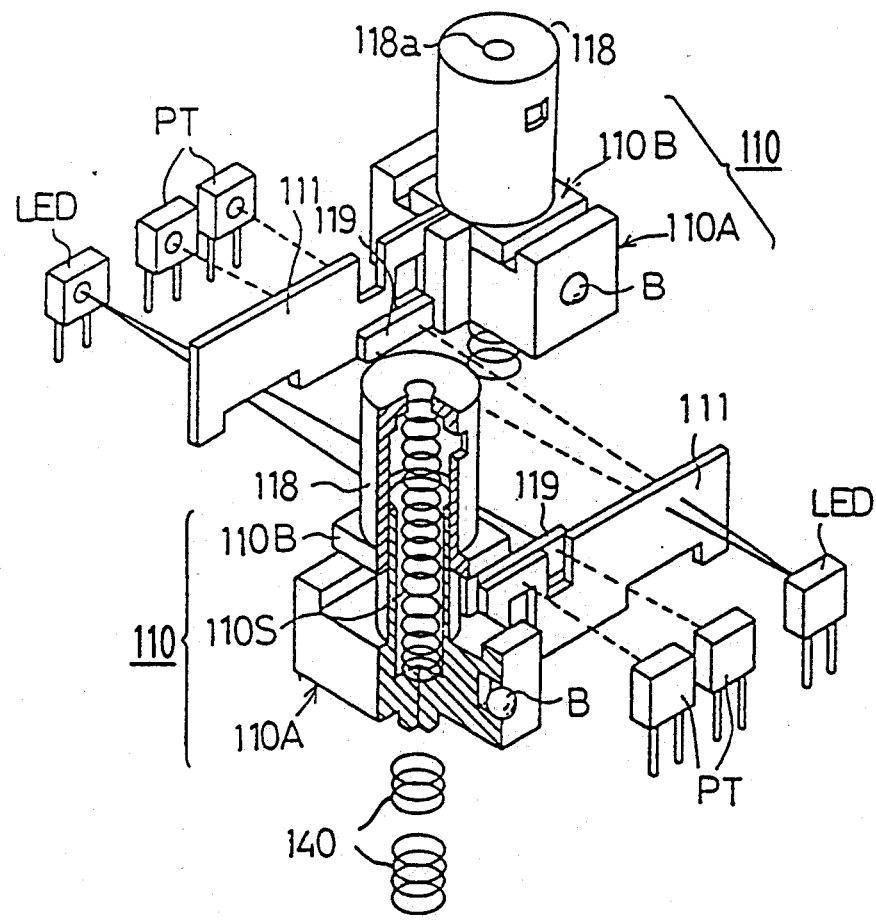
Figure 18:
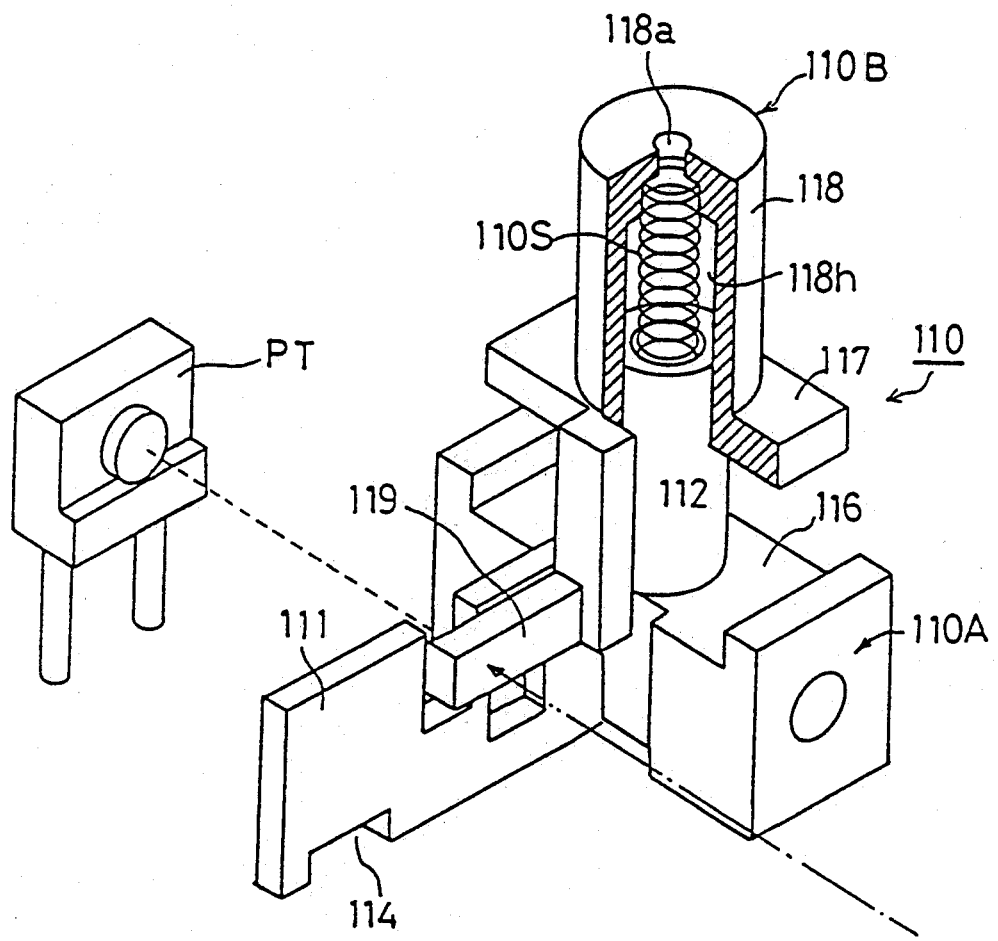
Figure 18:
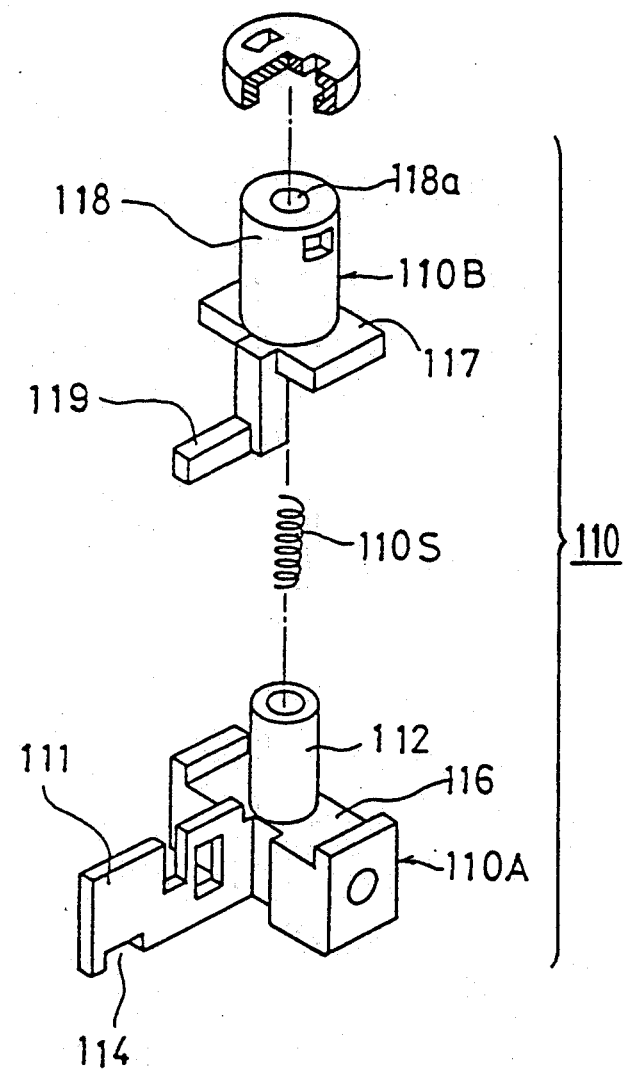
Figure 19:
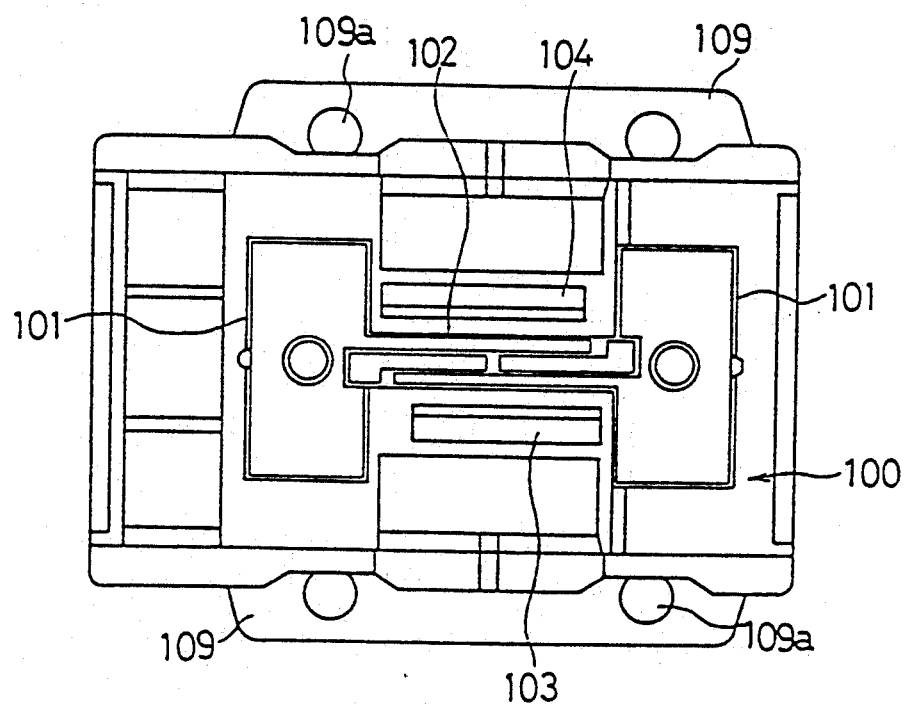

In assembling the parts of the above construction, as shown in FIG. 12, two opposite push-buttons 110 are inserted in the push-button inserting grooves 101 in such a manner that light shading plates 111 overlap each other and the pushing piece 112 projects from the top surface of the housing 100. In this case, the pushing piece 112 of the main push-button 110A is inserted in the pushing piece cavity 118h of the auxiliary button 110B through the medium of the spring 110S.

The base plate 120 with luminous elements and light receiving elements (print wiring) is then provided for the back of the housing 100. At this time, the light receiving element PT and the luminous element LED are inserted accurately in the element inserting groove 103 and the element inserting groove 104, respectively.

Next, the bottom lid 130 is fitted in and fixed to the guide 107 while the spring 140 is inserted in the spring support part 131, 132. Since the elastic force of the spring 104 is stronger than that of the spring 110S, the spring 110S is held in a compressed state. The housing 100 carries a fitting piece 109 having a fitting screw hole 109a to facilitate fitting to a switch case or the like.

When a push-button is pressed, it is pushed down against the force of a spring and the light from a luminous element on the side of that push-down reaches a light receiving element through a light transmitting window of a light shading plate which was pushed down, whereby the light is converted into an electric signal for the desired operation. At this time, the light from a luminous element on the other side is blocked by a push-down light shading piece of that push-button. Therefore, if both push-buttons are pressed by mistake, both are placed in an OFF state and the switch does not work.

When the switch works normally as mentioned above, since the elastic force of the spring 140 is stronger than that of the spring 110S, the spring 110S is in a compressed state and therefore the main push-button 110A and the auxiliary button 110B are united. Under this condition, both the light shading plate 111 and the auxiliary light shading plate 119 are pushed down with their light transmitting windows coinciding with each other, whereby light is transmitted in an optical path of the transmitting windows of the light shading plates 111, 119 and the switch is placed in an ON state.

There are cases where the push-button is placed in pressed down state due to breaking of the return spring 140 or due to jamming (or wedging) of foreign matter, and the push-button thus does not restore to an original state when the pressing down force is released. At such time, even if the switch is released, the switch ON state is maintained and it is impossible to place the switch in an OFF state. According to the present invention, even when the main push-button 110A is unrestorable to the original state due to damage of the spring 140 or due to some other reason, if the pressing down force is released, only the auxiliary button 110B is pushed up by action of the spring 110S, whereby the auxiliary light shading plate 119 of the auxiliary button 110B coincides with the light transmitting window 114 of the light shading plate 111 of the main push-button 110A and closes the light transmitting window 114. Thus, the light is blocked by the auxiliary button 110B even though the main push-button proper 110A is not restored an OFF position when the pressing down operation is released. The switch is turned OFF irrespective of whether or not the main push-button 110A is restored to its original position and safety can be maintained.

What is claimed is:

1. A non-contact switch comprising:
   a housing;
   a light emitting element and a light receiving element located within said housing,
   a push-button assembly located within and protruding from said housing, said push-button assembly comprising:
   a main push-button having a first shading plate fixed thereto, said main push-button having a top portion located outside of said housing, a bottom surface located within said housing and a hollow interior, a first spring applying an upward force against said bottom surface of said main push button; an auxiliary push button concentrically located along an outer periphery of said main push button and having a second shading plate fixed thereto; and a second spring located within said hollow interior of said main push button and applying an upward force against said auxiliary push button;
   wherein, upon a downward force applied to said main push button and said auxiliary push button, said first and second shading plates are together displaced to permit a passage of light from said light emitting element to said light receiving element;
   wherein, when said downward force is removed and said main push-button operates properly, said first and second shading plates are together displaced to an original position to block said passage of light from said light emitting element to said light receiving element; and
   wherein, when said downward force is removed and said main push-button operates improperly, only said similarly push-button returns to the original position to clock said passage of light.

* * * * *